United States Patent [19]

Sakano

[11] Patent Number: 5,013,988

[45] Date of Patent: May 7, 1991

[54] ABSOLUTE POSITION ENCODER

[75] Inventor: Tetsuro Sakano, Minamitsuru, Japan

[73] Assignee: Fanuc Ltd, Minamitsuru, Japan

[21] Appl. No.: 382,784

[22] PCT Filed: Oct. 18, 1988

[86] PCT No.: PCT/JP88/01061

§ 371 Date: Jun. 23, 1989

§ 102(e) Date: Jun. 23, 1989

[87] PCT Pub. No.: WO89/03976

PCT Pub. Date: May 5, 1989

[30] Foreign Application Priority Data

Oct. 29, 1987 [JP] Japan .................................. 62-274406

[51] Int. Cl.$^5$ ............................................ G05B 23/02
[52] U.S. Cl. ..................................... 318/602; 318/565; 318/480
[58] Field of Search ............... 318/254, 463, 480, 565, 318/568.25, 602, 605, 652, 653

[56] References Cited

U.S. PATENT DOCUMENTS 3,358,202 12/1967 Pabst et al. ..................... 318/480 X
3,699,421 10/1972 Stempler et al. ............... 318/480 X
3,706,924 12/1972 Adler ............................... 318/254 X
3,795,852 3/1974 Favard ............................ 318/480 X
3,956,681 5/1976 Vail et al. ........................... 318/640
4,228,396 10/1980 Palombo et al. ................. 318/272 X
4,358,753 11/1982 Cascini ............................ 340/347 P
4,507,590 3/1985 Miyazaki ............................ 318/254
4,779,075 10/1988 Zägelein et al. .
4,827,203 5/1989 Sakano ............................ 318/602 X

FOREIGN PATENT DOCUMENTS 55-111689 8/1980 Japan .................................. 318/254

Primary Examiner—Bentsu Ro
Attorney, Agent, or Firm—Staas & Halsey

[57] ABSTRACT

An absolute position encoder outputs position data as absolute data. When a power supply is turned on, absolute position data is read from an absolute code pattern (6) and is set in a counter (14). Thereafter, the counter (14) effects counting of incremental pulses read from an incremental code pattern (7) and increments the contents of the counter (14). Accurate absolute data referenced upon startup to the absolute code pattern can thus be output even during a high speed rotation.

9 Claims, 6 Drawing Sheets

| CH4 | CH3 | CH2 | CH1B | CH1A |
|-----|-----|-----|------|------|
| 0 | 0 | 0 | 0 | 0 |
| 0 | 0 | 0 | 0 | 1 |
| 0 | 0 | 0 | 1 | 1 |
| 0 | 0 | 0 | 1 | 0 |
| 0 | 0 | 1 | 0 | 0 |
| 0 | 0 | 1 | 0 | 1 |
| 0 | 0 | 1 | 1 | 1 |
| 0 | 0 | 1 | 1 | 0 |
| 0 | 1 | 0 | 0 | 0 |
| 0 | 1 | 0 | 0 | 1 |
| 0 | 1 | 0 | 1 | 1 |
| 0 | 1 | 0 | 1 | 0 |
| 0 | 1 | 1 | 0 | 0 |
| 0 | 1 | 1 | 0 | 1 |
| 0 | 1 | 1 | 1 | 1 |
| 0 | 1 | 1 | 1 | 0 |
| 1 | 0 | 0 | 0 | 0 |

FIG. 4

ABSOLUTE POSITION ENCODER

DESCRIPTION

1. Technical Field

The present invention relates to a position encoder, and more particularly, to an absolute position encoder capable of complying with high speed rotations.

2. Background Art

Position encoders have been extensively employed as a position detector in a computerized numerical controller (CNC) or a robot controller. Absolute position encoders have particularly been extensively employed as they are capable of accurately detecting position data even after a power supply is again turned on.

Conventional absolute position encoders which detect absolute positions are supplied with absolute data only from absolute code pattern formed in a code disk. The absolute code pattern requires a plurality of parallel patterns and is thus complex as compared with an incremental code pattern.

Accordingly, with the conventional absolute position encoders, it has been difficult in the case of high speed rotations to simultaneously read all the codes due to variations in delay time of detection circuits for detecting the plurality of parallel code patterns, hence a problem exists in that those encoders cannot comply with high speed rotations.

DISCLOSURE OF THE INVENTION

It is an object of the present invention to solve the above-mentioned problem and provide an absolute position encoder capable of complying with high speed rotations in which an absolute position detecting function is used in combination with an incremental position detecting function.

In order to solve the above problem, there is provided an absolute position encoder for outputting a position data as an absolute data, comprising:

a code member having an absolute code pattern and an incremental code pattern;

a counter for counting incremental pulses extracted from the incremental code pattern, said counter presetting an absolute position data extracted from the absolute code pattern; and an output circuit for outputting contents of said counter as the absolute data.

When a power supply is turned on, the absolute position data extracted from the absolute code pattern is set to the counter, whereby the counter is loaded with the absolute data.

After the absolute data has been set, the incremental pulses extracted from the incremental code pattern are counted and the contents of the counter are updated.

Accordingly, the counter retains the absolute data. This data is output to a computerized numerical controller (CNC) or a robot controller as absolute data.

BRIEF DESCRIPTION OF THE DRAWINGS

FIG. 4 shows changing absolute codes; and

DETAILED DESCRIPTION OF THE INVENTION

Embodiment of the present invention will now be described with reference to the accompanying drawings.

Figure 1:
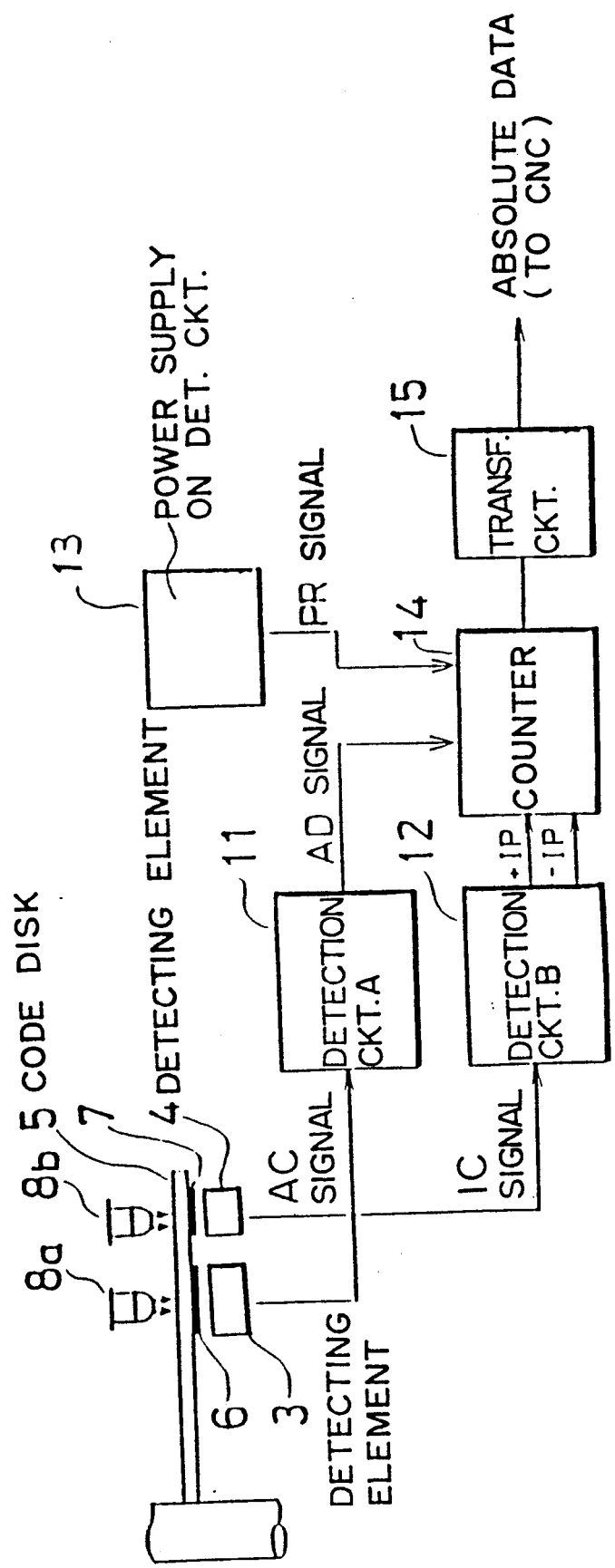
FIG. 1 is a block diagram illustrating an absolute rotary encoder according to one embodiment of the invention.

FIG. 1 is a block diagram showing an absolute rotary encoder according to the embodiment of the invention. In FIG. 1, a code disk 5 has a lower surface on which an absolute code pattern 6 and an incremental code pattern 7 are printed. Lights emitted from LEDs 8a, 8b are irradiated onto the code disk 5 and the lights which have passed through the code patterns 6, 7 are received respectively at detecting elements 3, 4, each comprising, for example, a photodiode. An absolute code signal (AC signal) and an incremental code signal (IC signal) are output from the detecting elements 3, 4, respectively. Details of the code disk 5, absolute code pattern 6, etc. will be described later.

A detection circuit A denoted by reference numeral 11 receives a minute absolute code signal (AC signal), in which the minute signal is amplified and is then subjected to waveform shaping whereupon an absolute position data signal (AD signal) is output therefrom. Another detection circuit B denoted by reference numeral 12 receives a minute incremental code signal (IC signal), in which the minute signal is amplified and is then subjected to waveform shaping. The detection circuit B selectively outputs a plus incremental pulse (+IP) and a minus incremental pulse (−IP) depending upon the rotational direction of the rotary encoder.

A power supply ON detection circuit 13 outputs a preset signal (PR signal) when a power supply is turned on.

A counter 14 presets the absolute data fed from the detection circuit A 11 in response to a preset signal (PR signal) from the power supply ON detection circuit 13. Thereafter, the counter 14 counts the plus incremental pulses (+IP) and the minus incremental pulses (−IP) both fed from the detection circuit B 12. Specifically, the counter 14 counts up the plus incremental pulse (+IP) and counts down the minus incremental pulse (−IP). The format of the count code of the counter 14 agrees with that of the absolute code to be described later.

A transferring circuit 15 outputs the contents of the counter 14 as absolute data to a computerized numerical controller (CNC) or a robot controller.

As described, the absolute data is preset in the counter 14 when the power supply is turned on and the counter 14 counts the incremental pulses. Therefore, an accurate pulse counting is ensured even at the time of high speed rotations of the rotary encoder, and the output of the absolute data is also ensured.

Figure 2:
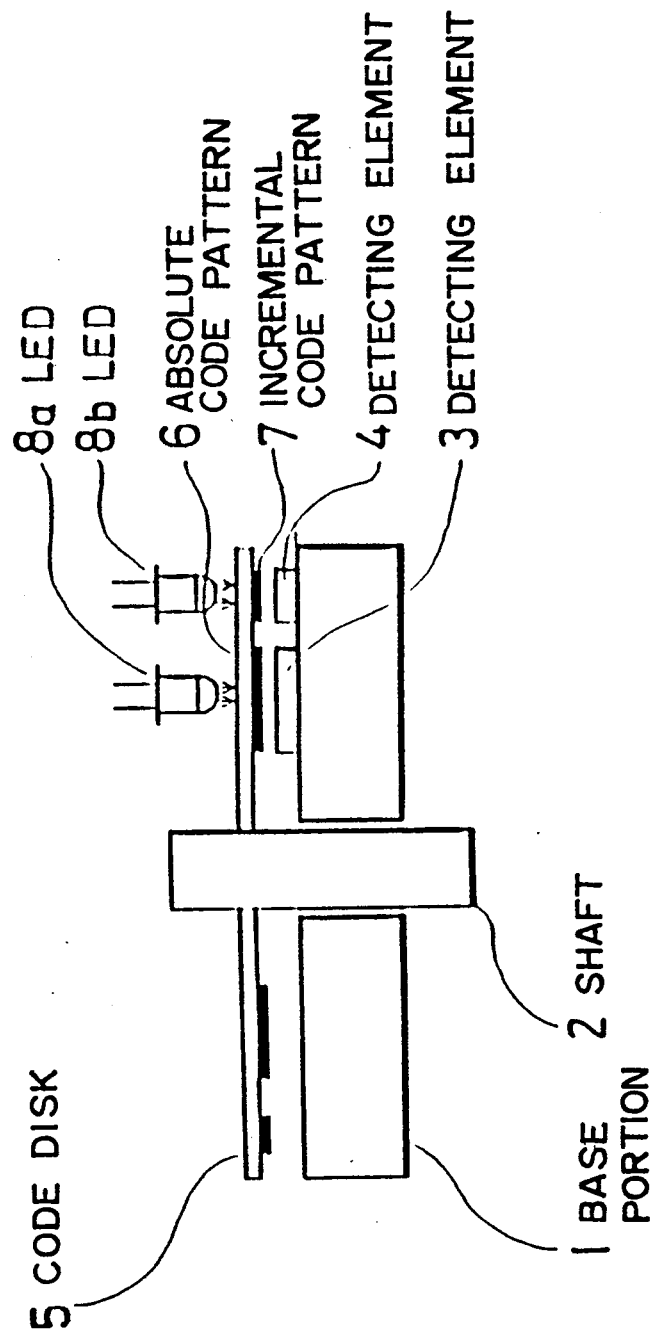
FIG. 2 is a schematic diagram illustrating an arrangement of the absolute rotary encoder according to the embodiment of the invention.

Next, an arrangement of the absolute rotary encoder will be described. FIG. 2 schematically illustrates the arrangement of the absolute rotary encoder according to one embodiment of the invention. In the figure, a base portion 1 is fixed to a frame (not shown) of the absolute rotary encoder. A shaft 2 is coupled directly or through gears to the rotational shaft of a servo motor. Light detecting elements 3, 4, such as photodiodes, are mounted on the base portion 1, which receive the lights having passed through the absolute code pattern 6 and the incremental code pattern 7 and output the absolute code signal and the incremental code signal, respectively.

Denoted by reference numeral 5 is the code disk 5, the lower surface of which is circumferentially formed with the absolute code pattern 6 and the incremental code pattern 7 by, for example, etching. Light emitting diodes 8a, 8b emit lights which are irradiated through the absolute code pattern 6 and the incremental code pattern 7 formed on the lower surface of the code disk onto the detecting elements 3, 4 to thereby output the absolute code signal (AC signal) and the incremental code signal (IC signal) dependent upon the rotational position and the amount of rotations of the shaft 2.

Figures 3A, 3B:
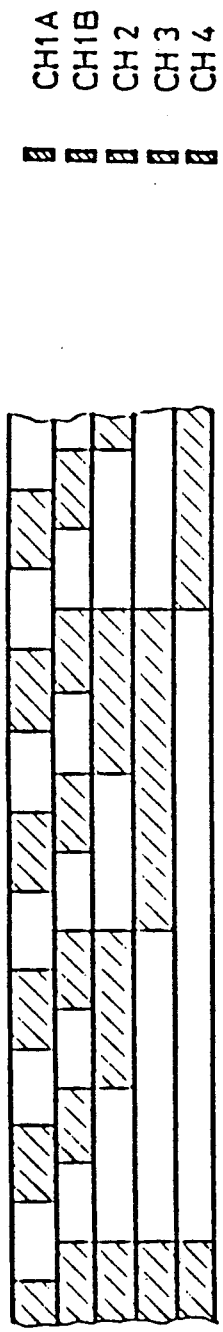
FIG. 3(a) shows an example of a code pattern.
FIG. 3(b) shows light receiving windows of detecting elements.
Figure 3C:
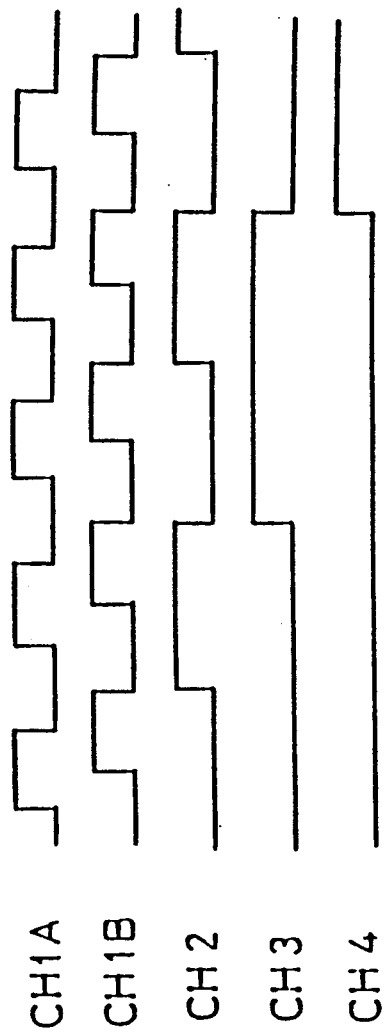
FIG. 3(c) shows an output signal from the absolute pattern.

A code pattern is exemplified in FIG. 3(a). In the figure, the code pattern formed in the circumferential direction is linearly exploded for the sake of easy understanding. Hatched segments indicate light transmissive portions. In FIG. 3(b), there are shown light receiving windows for the detecting elements 3, 4, and in FIG. 3(c), there are shown output signals from the detecting elements.

In the code pattern as exemplified, the absolute code is formed with five signals consisting of CH1A, CH1B, CH2, CH3 and CH4. The incremental code has the same code pattern arrangement as CH1A and CH1B, but CH1A and CH1B are commonly usable depending upon the situation.

FIG. 4 shows a sequence of the absolute codes, in which the code sequentially changes downwardly as the absolute rotary encoder rotates in clockwise direction. This code pattern agrees with the code in the interior of the counter 14. Although a plurality of code patterns are actually required because of the need for the number of columns in the absolute value, only a partial code pattern is shown herein for the purpose of simplification.

Figure 5A:
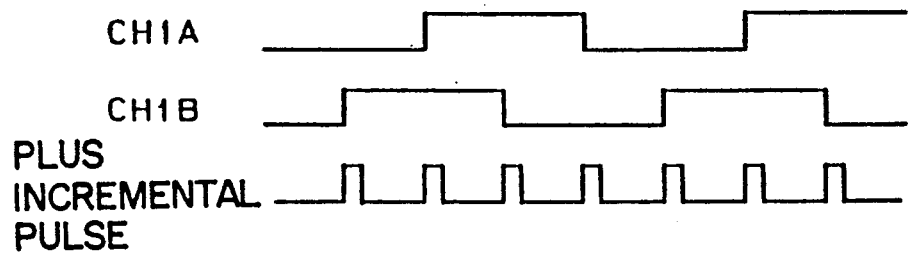
FIGS. 5(a) and 5(b) are diagrams illustrating relationships between incremental codes and incremental pulses.
Figure 5B:
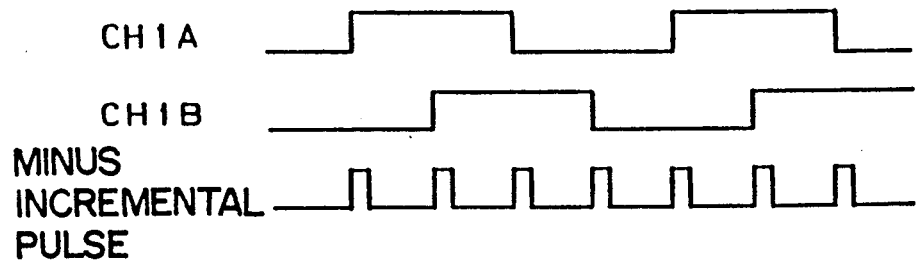

A relationship between the incremental code and the incremental pulse is shown in FIGS. 5(a) and 5(b). FIG. 5(a) shows such a relationship where the absolute rotary encoder rotates in clockwise direction, in which case the plus incremental pulse is outputted. FIG. 5(b) also shows such a relationship where the absolute rotary encoder rotates in counterclockwise direction, in which case the minus incremental pulse is outputted. As those pulses are applied to the counter 14, the latter effects up-counting or down-counting.

Although the above-described embodiment is directed to the absolute rotary encoder, the present invention is also applicable to an absolute linear encoder. The absolute linear encoder has a linearly extending code plate, so that the one shown in FIG. 3(a) is used as the code plate.

The number of the pattern codes and the pattern format as described above are non-limitative example, and a various number of the pattern codes and a desired pattern format can be selected as the case commands.

As described, according to the present invention, since the absolute code pattern is preset when the power supply is turned on and the incremental pulses are counted during rotations, accurate absolute data can be outputted even during a high speed rotation.

I claim:
1. An apparatus for position encoding, said apparatus comprising:
   a code encoder to output an absolute code and an incremental code, the incremental code output in a set of at least one incremental code signal;
   a position indicator to updata an indicated position by a predetermined value for every predetermined set of at least one incremental code signal output by said code encoder; and
   a reset circuit to set the indicated position of the position indicator to a value representative of the absolute code output by said code encoder when a power-up occurs.

2. An apparatus according to claim 1, wherein the predetermined set of at least one incremental code output by said code encoder consists of a pair of incremental codes.

3. An apparatus according to claim 2,
   further comprising an incremental code direction detector to output a direction signal to increment or decrement by the predetermined value the position indicated by said position indicator based on predetermined time relationships between the pair of incremental codes; and
   wherein said position indicator updates the indicated position by incrementing or decrementing based on the direction signal output from said incremental code direction detector.

4. An apparatus according to claim 1, wherein said position indicator is set by the absolute code output from said code encoder under control of said reset circuit.

5. An apparatus according to claim 1, wherein said code encoder is a rotary code encoder including a rotary disk.

6. An apparatus according to claim 1, wherein said code encoder is a linear code encoder including a linearly extending code pattern.

7. A method of position encoding, said method comprising the steps of:
   (a) indicating and outputting from a code encoder an absolute code and an incremental code, the incremental code output in a set of at least one incremental code signal;
   (b) updating an indicated position by a predetermined value for every predetermined set of at least one incremental code signal output of the code encoder; and
   (c) setting the indicated position to a value representative of the absolute code output by the code encoder when a reset occurs upon a power-up.

8. A method according to claim 7, wherein said indicating and outputting in step (a) includes outputting a pair of incremental code signals as the set of the at least one incremental code signal.

9. A method according to claim 8,
   further comprising the step of (d) outputting a direction signal to increment or decrement the indicated position by the predetermined value based on predetermined time relationships between the pair of incremental code signals; and
   wherein said updating in step (b) includes updating the indicated position by incrementing or decrementing based on the direction signal.

* * * * *

UNITED STATES PATENT AND TRADEMARK OFFICE
CERTIFICATE OF CORRECTION

PATENT NO. : 5,013,988

DATED : May 7, 1991

INVENTOR(S) : Sakano

It is certified that error appears in the above-identified patent and that said Letters Patent is hereby corrected as shown below:

Col. 2, line 12, "Embodiment" should be --Embodiments--.

Col. 4, line 7, "updata" shoud be --update--.

Signed and Sealed this

Eighteenth Day of August, 1992

Attest:

DOUGLAS B. COMER

*Attesting Officer*   Acting Commissioner of Patents and Trademarks